United States Patent
Wu et al.

(10) Patent No.: US 11,844,255 B2
(45) Date of Patent: Dec. 12, 2023

(54) DISPLAY DEVICE HAVING A SECOND ELECTRODE LAYER CONNECTED TO AN AUXILIARY ELECTRODE LAYER, DISPLAY PANEL AND MANUFACTURING METHOD THEREOF

(71) Applicants: Hefei BOE Joint Technology Co., Ltd., Beijing (CN); BOE TECHNOLOGY GROUP CO., LTD., Beijing (CN)

(72) Inventors: Zhongyuan Wu, Beijing (CN); Yongqian Li, Beijing (CN); Zhidong Yuan, Beijing (CN); Meng Li, Beijing (CN); Can Yuan, Beijing (CN)

(73) Assignees: Hefei BOE Joint Technology Co., Ltd, Anhui (CN); BOE TECHNOLOGY GROUP CO., LTD, Beijing (CN)

( * ) Notice: Subject to any disclaimer, the term of this patent is extended or adjusted under 35 U.S.C. 154(b) by 697 days.

(21) Appl. No.: 17/040,606

(22) PCT Filed: Dec. 20, 2019

(86) PCT No.: PCT/CN2019/127146
§ 371 (c)(1),
(2) Date: Sep. 23, 2020

(87) PCT Pub. No.: WO2021/120207
PCT Pub. Date: Jun. 24, 2021

(65) Prior Publication Data
US 2023/0104461 A1    Apr. 6, 2023

(51) Int. Cl.
*H10K 59/131* (2023.01)
*H10K 59/122* (2023.01)
(Continued)

(52) U.S. Cl.
CPC ....... *H10K 59/1315* (2023.02); *H10K 50/824* (2023.02); *H10K 50/828* (2023.02);
(Continued)

(58) Field of Classification Search
CPC ..... H10K 50/824; H10K 59/131–1315; H10K 50/822; H10K 50/828; H10K 59/12;
(Continued)

(56) References Cited

U.S. PATENT DOCUMENTS 10,727,292 B2 * 7/2020 Kim ..................... H10K 50/824
2013/0056784 A1  3/2013 Lee et al.
(Continued)

FOREIGN PATENT DOCUMENTS

CN           109037282 A     12/2018

OTHER PUBLICATIONS

Extended European Search Report for EP Patent Application No. 19945466.1 dated Nov. 21, 2022.

*Primary Examiner* — Younes Boulghassoul
(74) *Attorney, Agent, or Firm* — Perilla Knox & Hildebrandt LLP; Kenneth A. Knox

(57) ABSTRACT

A display panel includes a substrate, a pad, an auxiliary electrode layer, a data line layer, a first electrode layer, a light emitting layer, and a second electrode layer. The substrate has a display area and a peripheral area. The pad is disposed on a side of the substrate and located in the peripheral area. The auxiliary electrode layer is disposed on the same side of the substrate as the pad; the data line layer is disposed on a same layer as the auxiliary electrode layer; the first electrode layer is disposed on a side of the auxiliary electrode layer facing away from the substrate; the light emitting layer is disposed on a side of the first electrode layer facing away from the substrate; and the second electrode layer is disposed on a side of the light emitting layer (Continued)

facing away from the substrate and connected to the auxiliary electrode layer.

20 Claims, 3 Drawing Sheets

(51) Int. Cl.
  *H10K 50/86* (2023.01)
  *H10K 50/828* (2023.01)
  *H10K 59/124* (2023.01)
  *H10K 50/824* (2023.01)
  *H10K 59/12* (2023.01)
  *H10K 71/00* (2023.01)
  *H10K 102/10* (2023.01)
  *H10K 102/00* (2023.01)
(52) U.S. Cl.
  CPC ......... *H10K 50/865* (2023.02); *H10K 59/122* (2023.02); *H10K 59/124* (2023.02); *H10K 59/131* (2023.02); *H10K 71/00* (2023.02); *H10K 59/1201* (2023.02); *H10K 2102/102* (2023.02); *H10K 2102/103* (2023.02); *H10K 2102/3026* (2023.02)

(58) Field of Classification Search
  CPC .. H10K 59/122; H10K 59/123; H10K 59/124; H10K 59/1201; H10K 59/1213
  See application file for complete search history.

(56) References Cited

U.S. PATENT DOCUMENTS

| | | | |
|---|---|---|---|
| 2016/0190225 A1* | 6/2016 | Kim | H10K 59/131 |
| | | | 438/23 |
| 2016/0301031 A1 | 10/2016 | Mimura et al. | |
| 2018/0006098 A1* | 1/2018 | Hong | H01L 27/1248 |
| 2018/0097034 A1* | 4/2018 | Lee | H10K 59/124 |
| 2019/0006442 A1* | 1/2019 | Byun | H10K 59/124 |
| 2019/0148469 A1* | 5/2019 | Lhee | H10K 59/1315 |
| | | | 257/40 |
| 2019/0157609 A1* | 5/2019 | Suzuki | H10K 50/841 |
| 2019/0206979 A1 | 7/2019 | Han et al. | |
| 2019/0214446 A1* | 7/2019 | Kim | H10K 59/124 |
| 2019/0229164 A1* | 7/2019 | Kim | H10K 50/81 |
| 2020/0035773 A1 | 1/2020 | Cheng | |
| 2020/0185644 A1* | 6/2020 | Ohta | H10K 71/00 |
| 2021/0119178 A1* | 4/2021 | Song | H10K 50/86 |
| 2022/0376033 A1* | 11/2022 | Cho | H10K 50/824 |

* cited by examiner

DISPLAY DEVICE HAVING A SECOND ELECTRODE LAYER CONNECTED TO AN AUXILIARY ELECTRODE LAYER, DISPLAY PANEL AND MANUFACTURING METHOD THEREOF

CROSS-REFERENCE TO RELATED APPLICATIONS

This application is a national phase application under 35 U.S.C. § 371 of International Patent Application No. PCT/CN2019/127146 filed on Dec. 20, 2019, the entire contents of which are incorporated herein by reference as a part of this application.

TECHNICAL FIELD

The present disclosure relates to the field of display technology and, in particular, to a display device, a display panel, and a method of manufacturing the display panel.

BACKGROUND

In a top-emitting OLED display panel, a cathode of a transparent material and an anode of a reflective material are usually used. If a transparent conductive material such as indium tin oxide (ITO), indium zinc oxide (IZO), or the like is used as the cathode, the cathode has a low electrical conductivity although it has a high transmittance. Typically, the electrical conductivity is generally increased by adding an auxiliary cathode. The auxiliary cathode usually needs to be connected with a pad in a peripheral area of a display panel so as to input an signal, but a line connecting the auxiliary electrode and the pad usually has a large resistance, resulting in a higher voltage drop (IR Drop), and the voltage drop will also increase with an increase of a size of the display panel, causing signal transmission being affected.

It should be noted that the information disclosed in the Background section above is only used to enhance the understanding of the background of the present disclosure, and therefore may include information that does not constitute the prior art known to those of ordinary skill in the art.

SUMMARY

An objection of the present disclosure is providing a display device, a display panel, and a driving method thereof.

According to an aspect of the present disclosure, there is provided a display panel, comprising:

a substrate having a display area and a peripheral area surrounding the display area;

a pad disposed on a side of the substrate and located in the peripheral area;

an auxiliary electrode layer disposed on the same side of the substrate as the pad, the auxiliary electrode layer comprising auxiliary electrodes located in the display area;

a data line layer disposed on a same layer as the auxiliary electrode layer, and having a peripheral line portion located in the peripheral area, a projection of the peripheral line portion on the substrate being between projections of the pad and the auxiliary electrode layer on the substrate;

a first electrode layer disposed on a side of the auxiliary electrode layer facing away from the substrate, the first electrode layer having first electrodes comprising a light shielding metal material and located in the display area, and a bus located in the peripheral area and simultaneously connected with the pad and the auxiliary electrode layer;

a light emitting layer disposed on a side of the first electrode layer facing away from the substrate; and a second electrode layer disposed on a side of the light emitting layer facing away from the substrate and connected to the auxiliary electrode layer, the second electrode layer comprising a transparent conductive material.

In an exemplary embodiment of the present disclosure, the first electrode layer further has a transition portion located in the display area and connected with the auxiliary electrode layer, and the second electrode layer is connected to the auxiliary electrode layer through the transition portion.

In an exemplary embodiment of the present disclosure, the display panel further comprises:

a thin film transistor layer disposed on a side of the first electrode layer close to the substrate and comprising a source-drain layer having a source electrode and a drain electrode, the source-drain layer, the data line layer and the auxiliary electrode layer being different regions of a same film layer.

In an exemplary embodiment of the present disclosure, the thin film transistor layer further comprises:

a planarization layer covering the source-drain layer and the auxiliary electrode layer, the first electrode layer is disposed on a surface of the planarization layer facing away from the substrate, and the transition portion is connected to the auxiliary electrodes through a first via passing through the planarization layer.

In an exemplary embodiment of the present disclosure, the source-drain layer, the auxiliary electrode layer, the data line layer and the pad are different regions of a same film layer, and the pad is connected to the bus through a second via passing through the planarization layer.

In an exemplary embodiment of the present disclosure, the auxiliary electrode layer further comprises a connection portion located in the peripheral area, each of the auxiliary electrodes is connected to the connection portion, and the bus is connected to the connection portion through a third via passing through the planarization layer.

In an exemplary embodiment of the present disclosure, the display panel further comprises:

a pixel defining layer disposed on a surface of the planarization layer facing away from the substrate, and having a pixel area exposing the first electrode and a connection hole exposing the transition portion, the light emitting layer comprises light emitting units located in the pixel area, the second electrode layer covers the pixel defining layer and the light emitting layer, and the second electrode is connected to the transition portion through the connection hole.

According to an aspect of the present disclosure, there is provided a manufacturing method of a display panel, comprising:

providing a substrate having a display area and a peripheral area surrounding the display area;

forming a pad located in the peripheral region on a side of the substrate;

forming an auxiliary electrode layer and a data line layer which are disposed in a same layer on a side of the substrate, the auxiliary electrode layer, the data line layer being located on the same side of the substrate as the pad, the auxiliary electrode layer comprising auxiliary electrodes located in the display area, wherein the data line layer has a peripheral line portion located in the peripheral area, and a projection of the peripheral line portion on the substrate is located between projections of the pad and the auxiliary electrode layer on the substrate;

forming a first electrode layer of a light shielding metal material on a side of the auxiliary electrode layer facing away from the substrate, the first electrode layer having a first electrode located in the display area and a bus located in the peripheral area and simultaneously connected to the pad and the auxiliary electrode layer;

forming a light emitting layer on a side of the first electrode layer facing away from the substrate; and forming a second electrode layer of transparent conductive material on a side of the light emitting layer facing away from the substrate, the second electrode layer being connected to the auxiliary electrode layer.

In an exemplary embodiment of the present disclosure, the first electrode layer further has a transition portion located in the display area and connected to the auxiliary electrode layer, and the second electrode layer is connected to the auxiliary electrode layer through the transition portion.

In an exemplary embodiment of the present disclosure, the manufacturing method further comprises: before the forming of the first electrode layer, forming a thin film transistor layer on the side of the substrate, the thin film transistor layer comprising a source-drain layer having a source electrode and a drain electrode, the source-drain layer, the data line layer and the auxiliary electrode layer are formed through one patterning process.

In an exemplary embodiment of the present disclosure, the forming of the thin film transistor layer on the side of the substrate comprises:

forming a source-drain layer having a source electrode and a drain electrode on the side of the substrate; and forming a planarization layer covering the source-drain layer and the auxiliary electrode layer, the first electrode layer is disposed on a surface of the planarization layer facing away from the substrate, and the transition part is connected to the auxiliary electrodes through a first via hole passing through the planarization layer.

In an exemplary embodiment of the present disclosure, the source-drain layer, the auxiliary electrode layer, the data line layer, and the pad are formed by one patterning process, and the pad is connected to the bus by a second via passing through the planarization layer.

In an exemplary embodiment of the present disclosure, the auxiliary electrode layer further comprises a connecting portion located in the peripheral region, each of the auxiliary electrodes is connected to the connection portion, and the bus is connected to the connection portion through a third via passing through the planarization layer.

In an exemplary embodiment of the present disclosure, the manufacturing method further comprises: before the forming of the second electrode layer and after the forming of the planarization layer, forming a pixel defining layer on a surface of the planarization layer facing away from the substrate, the pixel defining layer having a pixel area exposing the first electrode and a connection hole exposing the transition portion, the light emitting layer comprises light emitting units located in the pixel area, and the second electrode layer covers the pixel defining layer and the light emitting layer, and the second electrode is connected to the transition portion through the connection hole.

According to an aspect of the present disclosure, there is providing a display device comprising the display panel according to anyone of above items.

It should be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the specification. Understandably, the drawings in the following description are just some embodiments of the present disclosure. For those of ordinary skill in the art, other drawings may be obtained based on these drawings without creative efforts.

DETAILED DESCRIPTION

Figure 1:
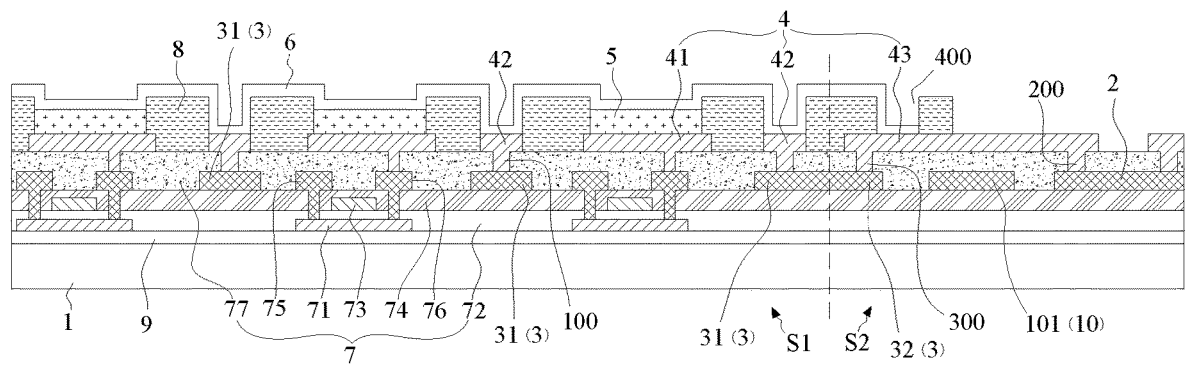
FIG. 1 is a cross-sectional view of an implementation of a display panel of the present disclosure.

Example implementations will now be described more fully with reference to the accompanying drawings. However, the example implementations can be implemented in various forms and should not be construed as limited to the implementations set forth herein; rather, these implementations are provided so that this disclosure will be thorough and complete, and will fully convey the concept of the example implementations to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms such as "up" and "down" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below". When a structure is "on" other structure(s), it may mean that the structure is integrally formed on the other structure(s), or that the structure is "directly" arranged on the other structure(s), or that the structure is "indirectly" arranged on other structure(s) through another structure.

The terms "a", "an", "the", "said", and "at least one" are used to indicate the presence of one or more elements/components/etc. The terms "comprising" and "including" are used to indicate open-ended inclusive means, and means that there may be additional elements/components/etc., in addition to the listed elements/components/etc.; and the terms "first", "second", and "third", etc. are only used as markers, not to limit the number of objects.

The description of reference numerals used in the figures is as follows: 1 substrate; 2 pad; 3 auxiliary electrode layer; 31 auxiliary electrode; 32 connection portion; 4 first electrode layer; 41 first electrode; 42 transition portion; 43 bus; 5 light emitting layer; 6 second electrode layer; 7 thin film transistor layer; 71 active layer; 72 gate insulating layer; 73 gate electrode; 74 dielectric layer; 75 source electrode; 76 drain electrode; 77 planarization layer; 8 pixel defining layer; 9 buffer layer; 10 data line layer; 101 peripheral line portion; 100 first via; 200 second via; 300 third via; 400 connection hole; 500 sub-pixel; and 600 driving circuit.

An implementation of the present disclosure provides a display panel, which may be a top-emitting OLED (Organic Light Emitting Diode) display panel. As shown in FIG. 1, the display panel includes a substrate 1, a pad 2, an auxiliary electrode layer 3, a first electrode layer 4, a light emitting layer 5, a second electrode layer 6, and a data line layer 10, wherein:

The substrate 1 has a display area S1 and a peripheral area S2 surrounding the display area S1. The pad 2 is provided on a side of the substrate 1 and located in the peripheral area S2. The auxiliary electrode layer 3 and the pad 2 are provided on a same side of the substrate 1, and the auxiliary electrode layer 3 includes auxiliary electrodes 31 located in the display area S1.

The data line layer 10 is provided in the same layer as the auxiliary electrode layer 3, and has a peripheral line portion 101 located in the peripheral area S2. A projection of the peripheral line portion 101 on the substrate 1 is between projections of the pad 2 and the auxiliary electrode layer 3 on the substrate 1.

The first electrode layer 4 is disposed on a side of the auxiliary electrode layer 3 facing away from the substrate 1, and has first electrodes 41 located in the display area S1 and comprising a light shielding metal material, and a bus 43 located in the peripheral area S2 and connected with the pad 2 and the auxiliary electrode layer 3.

The light emitting layer 5 is provided on a side of the first electrode layer 4 facing away from the substrate 1. The second electrode layer 6 is disposed on a side of the light emitting layer 5 facing away from the substrate 1 and is connected to the auxiliary electrode layer 3. The second electrode layer 6 comprises a transparent conductive material.

In the display panel of the implementation of the present disclosure, the second electrode layer 6 is connected to the auxiliary electrode layer 3, so that the resistance of the second electrode layer 6 is reduced due to the auxiliary electrode layer 3. Meanwhile, the pad 2 in the peripheral area S2 and the auxiliary electrode layer 3 in the display area S1 may be connected through the first electrode layer 4 to avoid disposing special connection lines, which may simplify a structure and process, and because the first electrode layer 4 is located in the a side of the data line layer 10 facing away from the substrate 1 so that the bus 43 and the peripheral line portion 101 are provided in different layers, respective patterns of the buses 43 and peripheral line portion 101 have enough spaces, which is helpful to reduce a difficulty in wiring and avoid the buses 43 and the peripheral line portion 101 from interfering with each other. In addition, since the first electrode layer 4 comprises a light shielding metal material and has a good electrical conductivity, a voltage drop may be prevented from being too high and signals may be protected from being affected.

It should be noted that, in the drawings, position relationships among respective layers of the display panel are only schematically shown so that those skilled in the art understand the scheme and principle of the implementations of the present disclosure, but do not constitute definitions on specific patterns of respective layers.

Respective portions of the display panel according to an implementation of the present disclosure are described in detail below:

As shown in FIG. 1, the substrate 1 has the display area S1 corresponding to a display area S1 of the display panel, and the peripheral area S2 surrounding the display area S1 and corresponding to a peripheral area S2 of the display panel. A material of the substrate 1 may be a hard material such as glass or a flexible material such as polyethylene terephthalate (PET), but is not specially limited herein.

As shown in FIG. 1, the pad 2 is provided on the side of the substrate 1 and is located in the peripheral region S2 described as above, that is, an orthographic projection of the pad 2 on the substrate 1 is located in the peripheral region S2, and is not limited to be directly provided on a surface of the substrate 1. The pad 2 may comprise a metal or alloy material such as aluminum, molybdenum, aluminum-neodymium or the like. A specific structure of the pad 2 is not specially limited herein, and the pad 2 may be connected with a power supply or other external circuits.

It should be noted that, in the implementation of the present disclosure, the meaning that any structure is located in the display area S1 or the peripheral area S2 is not limited that the structure is directly provided on a surface of the substrate 1, and also includes the case where an orthographic projection of the structure on the substrate 1 is located in the display area S1 or the peripheral area S2.

As shown in FIG. 1, the auxiliary electrode layer 3 may comprise a metal or alloy material such as aluminum, molybdenum, aluminum-neodymium or the like. Meanwhile, the auxiliary electrode layer 3 and the pad 2 are provided on the same side of the substrate 1, and may be disposed in the same layer. That is, the auxiliary electrode layer 3 and the pad 2 are different regions of a same film layer, and they have the same material herein. Of course, the auxiliary electrode layer 3 and the pad 2 may also be disposed in different layers, that is, they belong to different film layers, respectively.

The auxiliary electrode layer 3 includes the auxiliary electrodes 31 located in the display area S1. The shape and size of the auxiliary electrodes 31 are not specially limited herein. Further, the number of auxiliary electrodes 31 may be a plurality and the plurality of auxiliary electrodes 31 are arranged in an array.

The data line layer 10 may be provided in the same layer and located on the same side of the substrate 1 as the auxiliary electrode layer 3 and the pad 2. A data signal required for displaying an image may be transmitted through the data line layer 10. The data line layer 10 has a peripheral line portion 101, and the peripheral line portion 101 is located in the peripheral area S2. The data line layer 10 may further include a plurality of data lines (not shown in the drawing), each of which is located in the display area S1 and is connected with the peripheral line portion 101. The peripheral line portion 101 may serve as a bus for the data line. Meanwhile, the projection of the peripheral line portion 101 on the substrate 1 is between the projections of the pad 2 and the auxiliary electrode layer 3 on the substrate 1.

As shown in FIG. 1, the first electrode layer 4, the light emitting layer 5, and the second electrode layer 6 may constitute an OLED light emitting structure, which may include a plurality of OLED light emitting devices, in which:

The first electrode layer 4 is disposed on a side of the auxiliary electrode layer 3 facing away from the substrate 1. A material of the first electrode layer 4 is a light shielding metal material such as copper, platinum, or the like, which will not be listed herein.

The first electrode layer 4 may extend from the display area S1 to the peripheral area S2, and in particular, has the first electrodes 41 located in the display area S1 and the bus 43 located in the peripheral area S2 and connected with the pad 2. At the same time, projections of both the bus 43 and the peripheral line portion 101 on the substrate 1 at least partially overlap, such that the bus 43 may be connected with the auxiliary electrode layer 3 across the peripheral line portion 101 without interfering with a pattern of the peripheral line portion 101 for convenience of wiring.

Further, as shown in FIG. 1, the first electrodes 41 may be arranged in an array, and each of the first electrodes 41 may serve as an anode electrode of one OLED light emitting device. In some implementations of the present disclosure, the first electrode layer 4 may further include transition portions 42, and the transition portions 42 may be connected with the auxiliary electrode layer 3, be located in spaces between the first electrodes 41, and each be connected with the bus 43 so as to simultaneously input signals to respective transition portions 42. As an example, the number of the transition portions 42 and the auxiliary electrodes 31 are the same and both are a plurality. Each transition portion 42 is connected with each auxiliary electrode 31 in one-to-one correspondence. The second electrode layer 6 may be connected with the auxiliary electrodes 31 through the transition portion 42, which is helpful to shorten the path of the second electrode layer 6 extending to the auxiliary electrodes 31, and to avoid the case where the path of the second electrode layer 6 extending to the auxiliary electrodes 31 is too long and is easily disconnected during manufacturing.

In order to connect each transition portion 42 with the bus 43, in some implementations of the present disclosure, the auxiliary electrode layer 3 may further include a connection portion 32, which is located in the peripheral area and is connected with the bus 43. Meanwhile, each of the connection portions 42 may be connected to the connection portion 32, so that the bus 43 and the transition portions 42 are connected through the connection portion 32 of the auxiliary electrode layer 3 to connect the bus 43 to the second electrode layer 6.

Of course, in some implementations of the present disclosure, the transition portions 42 may also be directly connected to the bus 43 in the first electrode layer 4, that is, the transition portions 42 are connected to the bus 43 by providing a wiring for respective transition portions 42 without relaying through the auxiliary electrode 31 and the connection portion 32. However, the wiring connecting the transition portions 42 and the bus 43 needs to avoid the first electrode 41, that is, not connected to the first electrode 41.

As shown in FIG. 1, the light emitting layer 5 is provided on the side of the first electrode layer 4 facing away from the substrate 1, and it may emit light under the action of the first electrode layer 4 and the second electrode layer 6. As an example, the light emitting layer 5 may include a hole injection layer, a hole transport layer, an organic light emitting layer, an electron transport layer, and an electron injection layer that are sequentially laminated on the first electrode layer 4, and the specific principle of emitting light will not be described in detail herein. The light emitting layer 5 may include a plurality of light emitting units, and each of the light emitting units is located on each of the first electrodes 41 in one-to-one correspondence so as to form a plurality of OLED light emitting devices.

As shown in FIG. 1, the second electrode layer 6 may be used as a cathode electrode of the OLED display structure, and may use a transparent conductive material such as ITO, IZO, and the like. The second electrode layer 6 is disposed on the side of the light emitting layer 5 facing away from the substrate 1, and the OLED light emitting devices may share the second electrode layer 6. In some implementations of the present disclosure, the second electrode layer 6 is connected to the transition portions 42, and since the transition portions 42 are connected to the auxiliary electrode 31, the second electrode layer 6 may be connected to the auxiliary electrode 31 to increase an electrical conductivity of the second electrode layer 6. Meanwhile, the pad 2 may be connected to the second electrode layer 6 through the bus 43, the auxiliary electrode layer 3, and the transition portions 42, which is beneficial to increase an electrical conductivity and reduce a voltage drop of a line between the pad 2 and the second electrode layer 6.

Further, as shown in FIG. 1, the display panel of the implementation of the present disclosure may further include a thin film transistor layer 7. The thin film transistor layer 7 may be disposed on a side of the first electrode layer 4 close to the substrate 1. The thin film transistor layer 7 may comprise a plurality of thin film transistors, and respective thin film transistors are connected to respective first electrodes 41 in one-to-one correspondence for driving the above-mentioned OLED device to emit light.

The thin film transistor may adopt a top-gate structure or a bottom-gate structure, which is not specially limited herein. Taking the top-gate structure as an example, the thin film transistor layer 7 may include an active layer 71, a gate insulating layer 72, a gate electrode 73, a dielectric layer 74, and a source-drain layer, which are sequentially laminated in a direction away from the substrate 1. The source-drain layer includes a source electrode 75 and a drain electrode 76 connected to both ends of the active layer 71, and the drain electrode 76 may be connected with the first electrode 41. In order to simplify the structure and process, the source-drain layer, the auxiliary electrode layer 3 and the data line layer 10 may be formed by one patterning process such that the source-drain layer, the data line layer 10 and the auxiliary electrode layer 3 are different regions of a same film layer, i.e., being disposed at a same layer, and the three layers are arranged at an interval, that is, the film layer is not a continuous film layer. In addition, the data lines of the data line layer 10 may be connected to the source electrode 75 of the thin film transistor layer 7 so as to transmit data signals.

The above described thin film transistor layer 7 may further include a planarization layer 77, and the planarization layer 77 covers the source-drain layer and the dielectric layer 74, and may also cover the auxiliary electrode layer 3. The first electrode layer 4 is provided on a surface of the planarization layer 77 facing away from the substrate 1. Each of the transition portions 42 may be connected to the auxiliary electrode 31 directly opposite thereto through one first via 100 passing through the planarization layer 77.

In addition, as shown in FIG. 1, the above described pad 2 may also be provided in the same layer as the data line layer 10, the source-drain layer, and the auxiliary electrode layer 3, and the four are different regions of a same film layer. The pad 2 may be connected to the bus 43 by passing through a second via 200 of the planarization layer 77. Of course, the pad 2 may also be provided in the same layer as the gate electrode 73 of the thin film transistor layer 7.

Further, as shown in FIG. 1, the display panel of the implementation of the present disclosure may further include a pixel defining layer 8. The pixel defining layer 8 comprises a light shielding material, is disposed on a surface of the planarization layer 77 facing away from the substrate 1, and has a pixel area exposing the transition portions 42 and connection holes 400 exposing the transition portions 42. Respective light emitting units of the light emitting layer 5 are provided in respective pixel areas in one-to-one correspondence to form a plurality of sub-pixels, and all of the sub-pixels may be divided into a plurality of pixels, and each of the pixels includes a plurality of sub-pixels.

As an example, a plurality of OLED light emitting devices may be defined by the pixel defining layer 8. The second electrode layer 6 covers the pixel defining layer 8 and the light emitting layer 5. The second electrode layer 6 is connected to the transition portions 42 through the connection holes 400 and thus connected to the auxiliary electrodes 31. In addition, as shown in FIG. 1, in some implementations of the present disclosure, the bus 43 may be connected to the connection portion 32 of the auxiliary electrode layer 3 through a third via 300 passing through the planarization layer 77, and the connection portion 32 is connected with respective auxiliary electrodes 31.

Figure 2:
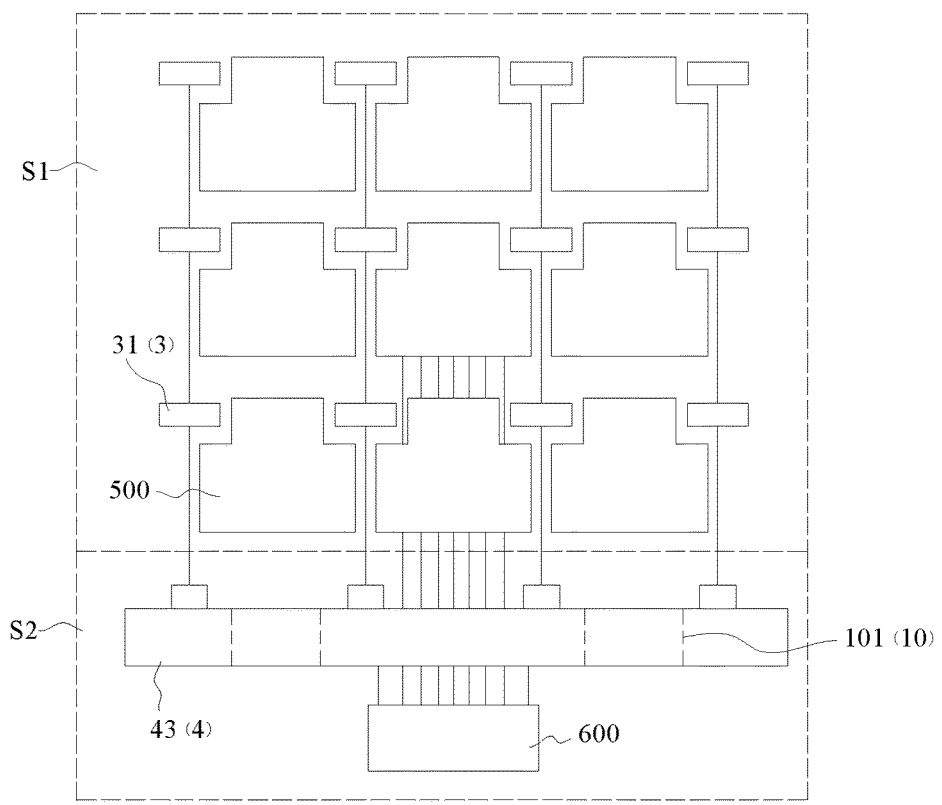
FIG. 2 is a top view of an implementation of a display panel of the present disclosure.

As shown in FIG. 2, which is a partial schematic view of a display panel, showing arrangement of respective auxiliary electrodes 31, respective sub-pixels 500 and the bus 43, both the auxiliary electrodes 31 and the sub-pixels 500 are arranged in the display area S1 in an array, i.e. in row and column directions, the bus 43 is located in the peripheral area S2, and the auxiliary electrodes 31 of respective columns and the sub-pixels 500 of respective columns are alternately arranged in the row direction. In addition, a driving circuit board 600 is also provided in the peripheral area S2, and is connected with the sub-pixels 500 to drive the sub-pixels 500 to emit light. The specific connection manner and circuit structure thereof are not specially limited herein, and FIG. 2 only schematically shows the arrangement manner, and does not constitute a limitation on the actual structure.

It should be noted that the direction and column directions in this specification only represent two different directions that intersect. Although the current viewing angles in each of the drawings are ones in horizontal and vertical directions, they do not mean that in the actual product, the row direction is necessarily a horizontal direction and the column direction is necessarily a vertical direction.

As shown in FIG. 1, the display panel of the implementation of the present disclosure may further include a buffer layer 9, which may be provided between the thin film transistor layer 7 and the substrate 1, and a material of the buffer layer 9 may be an insulating material such as silicon nitride, etc..

Figure 3:
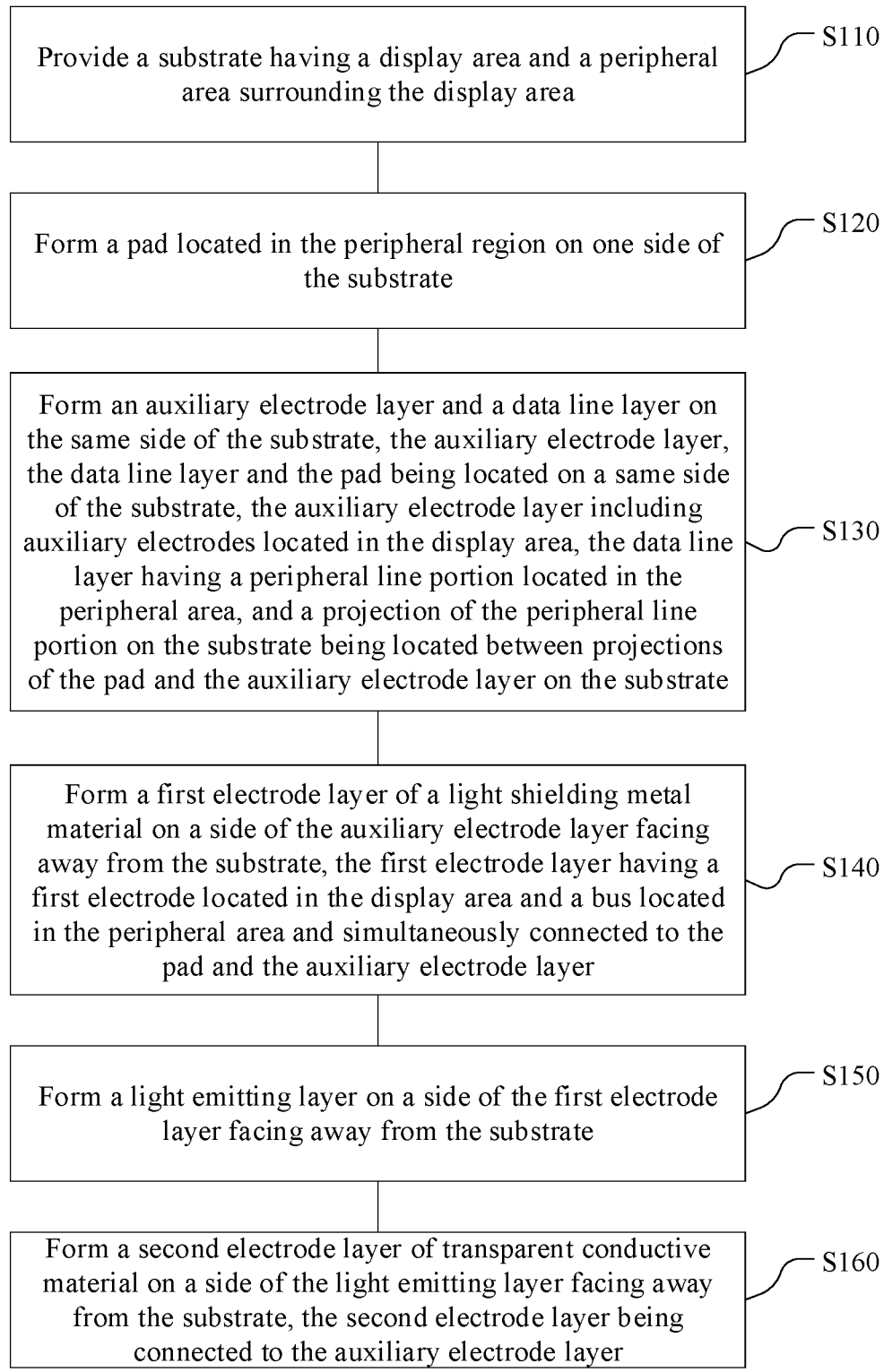
FIG. 3 is a flow chart of an implementation of a manufacturing method of a display panel of the present disclosure.

An implementation of the present disclosure provides a manufacturing method of a display panel, which may be the display panel according to the implementations described as above, and the structure thereof will not be repeated herein. As shown in FIG. 3, the manufacturing method includes steps S110-S160, in which:

Step S110: providing a substrate having a display area and a peripheral area surrounding the display area.

Step S120: forming a pad located in the peripheral region on one side of the substrate.

Step S130: forming an auxiliary electrode layer and a data line layer on the same side of the substrate, the auxiliary electrode layer, the data line layer and the pad being located on a same side of the substrate, the auxiliary electrode layer including auxiliary electrodes located in the display area, the data line layer having a peripheral line portion located in the peripheral area, and a projection of the peripheral line portion on the substrate being located between projections of the pad and the auxiliary electrode layer on the substrate.

Step S140: forming a first electrode layer of a light shielding metal material on a side of the auxiliary electrode layer facing away from the substrate, the first electrode layer having a first electrode located in the display area and a bus located in the peripheral area and simultaneously connected to the pad and the auxiliary electrode layer.

Step S150: forming a light emitting layer on a side of the first electrode layer facing away from the substrate.

Step S160: forming a second electrode layer of transparent conductive material on a side of the light emitting layer facing away from the substrate, the second electrode layer being connected to the auxiliary electrode layer.

In the manufacturing method of the implementation of the present disclosure, the pad 2 in the peripheral area and the auxiliary electrodes 31 in the display area may be connected through the first electrode layer 4 to avoid disposing a special connection line, and thus a structure and process may be simplified. At the same time, since the first electrode layer 4 comprises a light shielding metal material, it has a good electrical conductivity, thereby capable of preventing a voltage drop from being too high and avoiding a signal from being affected.

Figure 4:
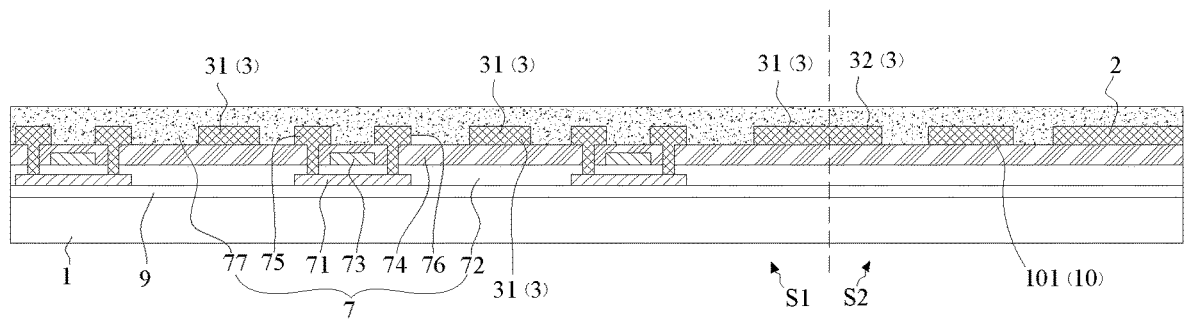
FIG. 4 is a schematic view corresponding to Step S170 in an implementation of a manufacturing method of a display panel of the present disclosure.
Figure 5:
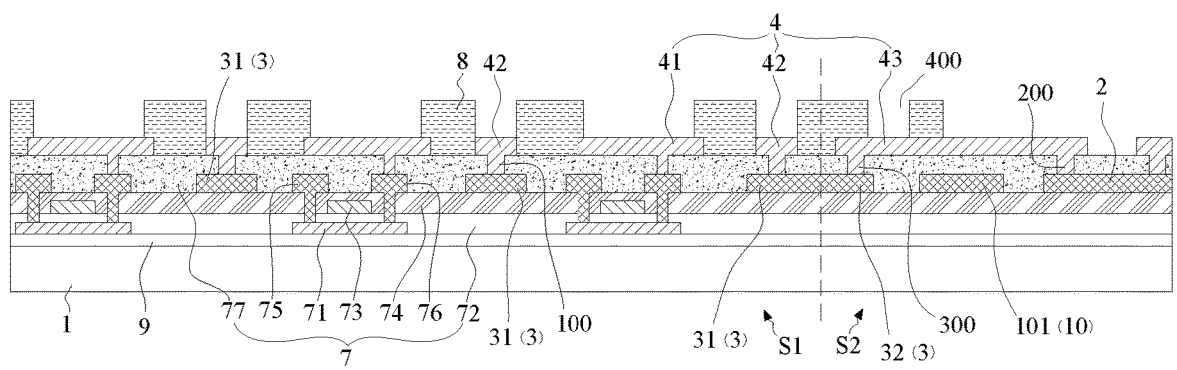
FIG. 5 is a schematic view corresponding to Step S180 in an implementation of a manufacturing method of a display panel of the present disclosure.

As shown in FIGS. 1, 4 and 5, respective steps of the manufacturing method of the implementation of the present disclosure will be described below.

In step S110, a structure of the substrate 1 may refer to the substrate 1 described as above in the implementation of the display panel, which will not be described in detail herein.

In step S120, a structure of the pad 2 may refer to the pad 2 described as above in the implementation of the display panel, which will not be described in detail herein. The pad 2 may comprise a metal or alloy material such as aluminum, molybdenum, aluminum-neodymium, or the like, and it may be formed by a patterning process such as photolithography, printing or the like, which is not specially limited herein.

In step S130, a structure of the auxiliary electrode layer 3 may refer to the auxiliary electrode layer 3 described as above in the implementation of the display panel, which will not be described in detail herein. The auxiliary electrode layer 3 may also be formed by a patterning process such as photolithography, printing or the like, which is not specially limited herein. Further, the pad 2, the data line layer 10, and the auxiliary electrode layer 3 may be formed by one patterning process so that they are arranged in the same layer to simplify the process, that is, steps S120 and S130 may be combined into a same one step.

In step S140, a structure of the first electrode layer 4 may refer to the first electrode layer 4 described as above in the implementation of the display panel, which will not be described in detail herein. The first electrode layer 4 may be formed by a patterning process such as photolithography, printing or the like, which is not specially limited herein.

In step S150, a structure of the light emitting layer 5 may refer to the light emitting layer 5 described as above in the implementation of the display panel, which will not be described in detail herein. The light emitting layer 5 may be formed by a patterning process such as evaporation, which is not specially limited herein.

In step S160, a structure of the second electrode layer 6 may refer to the second electrode layer 6 described as above in the implementation of the display panel, which will not be described in detail herein. The second electrode layer 6 may be formed by a patterning process such as photolithography, printing, or the like, which is not specially limited herein.

Further, before forming the first electrode layer 4, that is, before step S140, the manufacturing method of the implementation of the present disclosure further includes:

Step S170: forming a thin film transistor layer on the one side of the substrate, the thin film transistor layer including a source-drain layer having a source electrode and a drain electrode; and forming an auxiliary electrode layer by one patterning process together with the source-drain layer.

In step S170, as shown in FIG. 4, a structure of the thin film transistor layer 7 may refer to the thin film transistor 7 described as above in the implementation of the display panel. Taking a top gate structure as an example, the thin film transistor layer 7 may include an active layer 71, a gate insulating layer 72, a gate electrode 73, a dielectric layer 74, and a source-drain layer, which are sequentially laminated in a direction away from the substrate 1, the source-drain layer including a source electrode 75 and a drain electrode 76 connected to both ends of the active layer 71.

The source-drain layer, the data line layer 10 and the auxiliary electrode layer 3 may be formed by one patterning process, such that the source-drain layer, the data line layer 10 and the auxiliary electrode layer 3 are different regions of a same film layer, that is, arranged in a same layer. In addition, the above mentioned pad 2 may also be provided in the same layer as the source-drain layer, the data line layer 10 and the auxiliary electrode layer 3, the four components are different regions of the same film layer, and the pad 2 may be connected to a bus 43 through a second via passing through the planarization layer 77.

Of course, the pad 2 may also be provided in the same layer as the gate electrode 73 of the thin film transistor layer 7 and be formed by one patterning process.

In one implementation, the thin film transistor layer is formed on the one side of the substrate, that is, step S170, which includes step S1710 and step S1720, wherein:

Step S1710: forming a source-drain layer having source and drain electrodes on the one side of the substrate.

Step S1720: forming a planarization layer covering the source-drain layer and the auxiliary electrode layer.

The first electrode layer is provided on a surface of the planarization layer facing away from the substrate, and the transition portion is connected to the auxiliary electrode through a first via passing through the planarization layer.

As shown in FIG. 4, taking a top gate structure thin film transistor as an example, before step S1710, step S170 may further include sequentially forming an active layer 71, a gate insulating layer 72, a gate electrode 73, and a dielectric layer 74 on one side of the substrate 1, and forming a source-drain layer on a surface of the dielectric layer 74 facing away from the substrate.

In step S1720, as shown in FIG. 4, the planarization layer 77 covers the source-drain layer and the dielectric layer 74, and may also cover the auxiliary electrode layer 3. The first electrode layer 4 is disposed on a surface of the planarization layer 77 facing away from the substrate 1, and each of the transition portions 42 may be connected to one auxiliary electrode 31 directly opposite thereto through the first via passing through the planarization layer 77.

In one implementation, a portion of areas of the auxiliary electrode layer 3 extends to the peripheral area, and the portion of areas of the auxiliary electrode layer 3 extending to the peripheral area is directly opposite to the bus 43 and is connected to the bus 43 by a third via passing through the planarization layer 77.

In addition, before the thin film transistor layer 7 is formed, a buffer layer 9 may be formed on the substrate 1. The thin film transistor layer 7 may be formed on a surface of the buffer layer 9 facing away from the substrate 1.

Furthermore, after forming the planarization layer 77, and before forming the second electrode layer 6, that is, after step S1720 and before step S160, the manufacturing method of the present disclosure may further include:

Step S180: forming a pixel defining layer on the surface of the planarization layer facing away from the substrate, the pixel defining layer having a pixel area exposing the first electrode and a connection hole exposing the transition portion;

The light emitting layer includes light emitting units located in the pixel area;

The second electrode layer covers the pixel defining layer and the light emitting layer, and the second electrode is connected to the transition portion through the connection hole.

In step S180, as shown in FIG. 5, the pixel defining layer 8 comprises a light shielding material, is provided on a surface of the planarization layer 77 facing away from the substrate 1, and has a pixel area exposing the first electrode 41 and a connection hole 400 exposing the transition portion 42. Respective light emitting units of the light emitting layer 5 are provided in respective pixel areas in one-to-one correspondence. That is to say, a plurality of OLED light emitting devices may be defined by the pixel defining layer 8. The second electrode layer 6 covers the pixel defining layer 8 and the light emitting layer 5, and is connected to the transition portions 42 through the connection hole 400 and thus connected to the auxiliary electrodes 31.

It should be noted that although the respective steps of the method in the present disclosure are described in a specific order in the drawings, this does not require or imply that the steps must be performed in the specific order, or all steps shown must be performed to achieve desired results. Additionally or alternatively, certain steps may be omitted, multiple steps may be combined into one step for execution, and/or one step may be split into multiple steps for execution, and the like.

Implementations of the present disclosure also provide a display device including the display panel of any of the above implementations. Since the display device uses the display panel of the above implementations, they can solve the same technical problems and have the same beneficial effects. The display device of the implementations of the present disclosure may be used in electronic devices such as mobile phones, tablet computers, or electronic paper.

Those skilled in the art will readily contemplate other embodiments of the present disclosure after considering the specification and practicing the invention disclosed herein. This application is intended to cover any variations, uses, or adaptations of the present disclosure that conform to the general principles of the disclosure and include the common general knowledge or conventional technical means in the technical field not disclosed by the disclosure. It is intended that the specification and examples be considered as exemplary only, with a true scope and spirit of the disclosure being indicated by the appended claims.

What is claimed is:
1. A display panel, comprising:
a substrate having a display area and a peripheral area surrounding the display area;
a pad disposed on a side of the substrate and located in the peripheral area;

an auxiliary electrode layer disposed on a same side of the substrate as the pad, the auxiliary electrode layer comprising auxiliary electrodes located in the display area;
a data line layer disposed on a same layer as the auxiliary electrode layer, and having a peripheral line portion located in the peripheral area, a projection of the peripheral line portion on the substrate being located between projections of the pad and the auxiliary electrode layer on the substrate;
a first electrode layer disposed on a side of the auxiliary electrode layer facing away from the substrate, the first electrode layer having a first electrode and a bus, the first electrode comprising a light shielding metal material and being located in the display area, the bus being located in the peripheral area and connected to the pad and the auxiliary electrode layer;
a light emitting layer disposed on a side of the first electrode layer facing away from the substrate; and
a second electrode layer disposed on a side of the light emitting layer facing away from the substrate and connected to the auxiliary electrode layer, the second electrode layer comprising a transparent conductive material.

2. The display panel according to claim 1, wherein the first electrode layer further has a transition portion located in the display area and connected with the auxiliary electrode layer, and the second electrode layer is connected to the auxiliary electrode layer through the transition portion.

3. The display panel according to claim 2, further comprising:
a thin film transistor layer disposed on a side of the first electrode layer close to the substrate and comprising a source-drain layer having a source electrode and a drain electrode, the source-drain layer, the data line layer and the auxiliary electrode layer being located in different regions of a same film layer.

4. The display panel according to claim 3, wherein the thin film transistor layer further comprises:
a planarization layer covering the source-drain layer and the auxiliary electrode layer;
wherein the first electrode layer is disposed on a surface of the planarization layer facing away from the substrate, and the transition portion is connected to the auxiliary electrodes through a first via passing through the planarization layer.

5. The display panel according to claim 4, wherein the source-drain layer, the auxiliary electrode layer, the data line layer and the pad are located in different regions of the same film layer, and the pad is connected to the bus through a second via passing through the planarization layer.

6. The display panel according to claim 4, wherein the auxiliary electrode layer further comprises a connection portion located in the peripheral area, each of the auxiliary electrodes is connected to the connection portion, and the bus is connected to the connection portion through a third via passing through the planarization layer.

7. The display panel according to claim 4, further comprising:
a pixel defining layer disposed on a surface of the planarization layer facing away from the substrate, and having a pixel area exposing the first electrode and a connection hole exposing the transition portion;
wherein the light emitting layer comprises light emitting units located in the pixel area, the second electrode layer covers the pixel defining layer and the light emitting layer, and the second electrode layer is connected to the transition portion through the connection hole.

8. A manufacturing method of a display panel, comprising:
providing a substrate having a display area and a peripheral area surrounding the display area;
forming a pad located in the peripheral area on a side of the substrate;
forming an auxiliary electrode layer and a data line layer disposed in a same layer on a side of the substrate, the auxiliary electrode layer and the data line layer being located on a same side of the substrate as the pad, the auxiliary electrode layer comprising auxiliary electrodes located in the display area, wherein the data line layer has a peripheral line portion located in the peripheral area, and a projection of the peripheral line portion on the substrate is located between projections of the pad and the auxiliary electrode layer on the substrate;
forming a first electrode layer of a light shielding metal material on a side of the auxiliary electrode layer facing away from the substrate, the first electrode layer having a first electrode and a bus, the first electrode being located in the display area, the bus being located in the peripheral area and connected to the pad and the auxiliary electrode layer;
forming a light emitting layer on a side of the first electrode layer facing away from the substrate; and
forming a second electrode layer of a transparent conductive material on a side of the light emitting layer facing away from the substrate, the second electrode layer being connected to the auxiliary electrode layer.

9. The manufacturing method according to claim 8, wherein the first electrode layer further has a transition portion located in the display area and connected to the auxiliary electrode layer, and the second electrode layer is connected to the auxiliary electrode layer through the transition portion.

10. The manufacturing method according to claim 9, before forming the first electrode layer, further comprising:
forming a thin film transistor layer on the side of the substrate, the thin film transistor layer comprising a source-drain layer having a source electrode and a drain electrode;
wherein the source-drain layer, the data line layer and the auxiliary electrode layer are formed through one patterning process.

11. The manufacturing method according to claim 10, wherein forming the thin film transistor layer on the side of the substrate comprises:
forming the source-drain layer having the source electrode and the drain electrode on the side of the substrate; and
forming a planarization layer covering the source-drain layer and the auxiliary electrode layer,
wherein the first electrode layer is disposed on a surface of the planarization layer facing away from the substrate, and the transition portion is connected to the auxiliary electrodes through a first via hole passing through the planarization layer.

12. The manufacturing method according to claim 11, wherein the source-drain layer, the auxiliary electrode layer, the data line layer, and the pad are formed by one patterning process, and the pad is connected to the bus by a second via passing through the planarization layer.

13. The manufacturing method according to claim 11, wherein the auxiliary electrode layer further comprises a connecting portion located in the peripheral area, each of the auxiliary electrodes is connected to the connection portion, and the bus is connected to the connection portion through a third via passing through the planarization layer.

14. The manufacturing method according to claim 11, before forming the second electrode layer and after forming the planarization layer, further comprising:
   forming a pixel defining layer on a surface of the planarization layer facing away from the substrate, the pixel defining layer having a pixel area exposing the first electrode and a connection hole exposing the transition portion,
   wherein the light emitting layer comprises light emitting units located in the pixel area, and
   wherein the second electrode layer covers the pixel defining layer and the light emitting layer, and the second electrode layer is connected to the transition portion through the connection hole.

15. A display device, comprising t a display panel, the display panel comprising:
   a substrate having a display area and a peripheral area surrounding the display area;
   a pad disposed on a side of the substrate and located in the peripheral area;
   an auxiliary electrode layer disposed on a same side of the substrate as the pad, the auxiliary electrode layer comprising auxiliary electrodes located in the display area;
   a data line layer disposed on a same layer as the auxiliary electrode layer, and having a peripheral line portion located in the peripheral area, a projection of the peripheral line portion on the substrate being located between projections of the pad and the auxiliary electrode layer on the substrate;
   a first electrode layer disposed on a side of the auxiliary electrode layer facing away from the substrate, the first electrode layer having a first electrode and a bus, the first electrode comprising a light shielding metal material and being located in the display area, the bus being located in the peripheral area and connected to the pad and the auxiliary electrode layer;
   a light emitting layer disposed on a side of the first electrode layer facing away from the substrate; and
   a second electrode layer disposed on a side of the light emitting layer facing away from the substrate and connected to the auxiliary electrode layer, the second electrode layer comprising a transparent conductive material.

16. The display device according to claim 15, wherein the first electrode layer further has a transition portion located in the display area and connected with the auxiliary electrode layer, and the second electrode layer is connected to the auxiliary electrode layer through the transition portion.

17. The display device according to claim 16, wherein the display panel comprises:
   a thin film transistor layer disposed on a side of the first electrode layer close to the substrate and comprising a source-drain layer having a source electrode and a drain electrode, the source-drain layer, the data line layer and the auxiliary electrode layer being located in different regions of a same film layer.

18. The display device according to claim 17, wherein the thin film transistor layer further comprises:
   a planarization layer covering the source-drain layer and the auxiliary electrode layer;
   wherein the first electrode layer is disposed on a surface of the planarization layer facing away from the substrate, and the transition portion is connected to the auxiliary electrodes through a first via passing through the planarization layer.

19. The display device according to claim 18, wherein the source-drain layer, the auxiliary electrode layer, the data line layer and the pad are located in different regions of the same film layer, and the pad is connected to the bus through a second via passing through the planarization layer.

20. The display device according to claim 18, wherein the auxiliary electrode layer further comprises a connection portion located in the peripheral area, each of the auxiliary electrodes is connected to the connection portion, and the bus is connected to the connection portion through a third via passing through the planarization layer.

* * * * *